US008783051B2

(12) United States Patent
Kundapur

(10) Patent No.: US 8,783,051 B2
(45) Date of Patent: Jul. 22, 2014

(54) DATA PROCESSING SYSTEM STORAGE UNIT, DATA PROCESSING SYSTEM COOLING APPARATUS AND DATA PROCESSING SYSTEM

(75) Inventor: Krishnamurthy Kundapur, Karnataka (IN)

(73) Assignee: Hewlett-Packard Development Company, L.P., Houston, TX (US)

( * ) Notice: Subject to any disclaimer, the term of this patent is extended or adjusted under 35 U.S.C. 154(b) by 1335 days.

(21) Appl. No.: 12/060,804

(22) Filed: Apr. 1, 2008

(65) Prior Publication Data
US 2008/0239659 A1  Oct. 2, 2008

(30) Foreign Application Priority Data
Apr. 2, 2007  (IN) .............................. 697/CHE/2007

(51) Int. Cl.
*F25D 17/06*  (2006.01)
(52) U.S. Cl.
USPC ........................................... 62/259.2; 62/418
(58) Field of Classification Search
USPC ........... 62/259.2, 418; 700/300, 277; 454/184
See application file for complete search history.

(56) References Cited

U.S. PATENT DOCUMENTS

| | | | |
|---|---|---|---|
| 5,740,018 A * | 4/1998 | Rumbut, Jr. .................... 361/720 |
| 6,658,995 B1 | 12/2003 | DeYoung et al. |
| 6,951,110 B2 * | 10/2005 | Kang ................................ 60/772 |
| 2003/0147216 A1 * | 8/2003 | Patel et al. ..................... 361/700 |
| 2003/0150231 A1 * | 8/2003 | Spinazzola et al. .......... 62/259.2 |
| 2003/0223193 A1 | 12/2003 | Smith et al. |
| 2004/0020224 A1 | 2/2004 | Bash et al. |

* cited by examiner

*Primary Examiner* — Cassey D Bauer

(57) ABSTRACT

A data processing system storage unit for storing a plurality of data processing systems is disclosed. In one example of the storage unit, a plurality of storage spaces, each storage space configured for storing a data processing system, is provided. An air inlet duct and an air outlet duct allow air circulation within the storage unit. A plurality of inlet conduits, each inlet conduit configured to connect the inlet air duct to an inlet port of a data processing system, provides air supply to the data processing system. A plurality of outlet conduits, each outlet conduit configured to connect the outlet air duct to an outlet port of a data processing system, provides air exhaust from the data processing system. The example storage unit may also provide a primary air transfer system configured for directing air into the air inlet duct and/or for extracting air from the air outlet duct.

19 Claims, 2 Drawing Sheets

DATA PROCESSING SYSTEM STORAGE UNIT, DATA PROCESSING SYSTEM COOLING APPARATUS AND DATA PROCESSING SYSTEM

RELATED APPLICATIONS

This patent application claims priority to an Indian patent application, filed in India and having application serial no. 697/CHE/2007, titled "Data Processing System Storage Unit, Data Processing System Cooling Apparatus and Data Processing System", filed on 2 Apr. 2007, commonly assigned herewith, and hereby incorporated by reference.

BACKGROUND TO THE INVENTION

Multiple data processing systems, such as servers, may be mounted within storage units, such as racks or cabinets, when they are in operation. One or more storage units, each containing one or more data processing systems, may be located within a room. Each data processing system contains one or more fans for cooling the components within the data processing system, such that ambient air in the room is drawn into the data processing system, passed over the components within the data processing system and passed back into the room. The air in the room may be cooled (for example, by air-conditioning). A large number of fans may be operating within the room. As a result, the power required by the fans may be large, and the fans may produce a considerable amount of noise.

It is an object of embodiments of the invention to at least mitigate one or more of the problems of the prior art.

BRIEF DESCRIPTION OF THE DRAWINGS

Embodiments of the invention will now be described by way of example only, with reference to the accompanying drawings, in which.

DETAILED DESCRIPTION OF EMBODIMENTS OF THE INVENTION

Embodiments of the invention reduce the number of fans required in a storage unit storing data processing systems when they are in operation. For example, fans are not required within the data processing systems, or the number of fans in the data processing systems can be reduced. Instead, the storage unit itself comprises a cooling system including one or more blowers, fans, compressors or the like and a system for directing air through the data processing systems, thus cooling the data processing systems.

Figure 1:
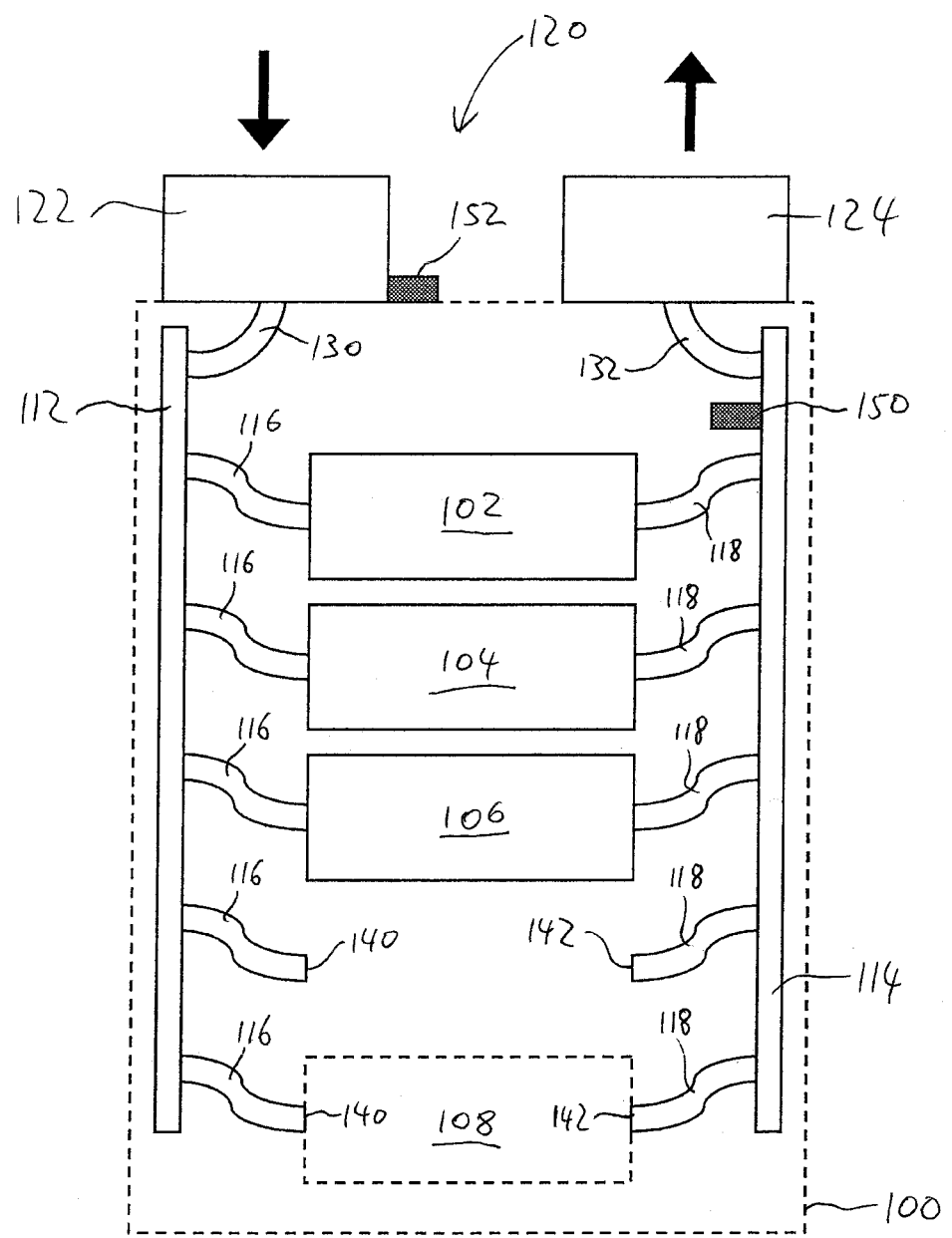
FIG. 1 shows a side view of a storage unit according to embodiments of the invention containing data processing systems.

FIG. 1 shows a storage unit 100 that includes five storage spaces, whereby each storage space may contain a data processing system. In other embodiments of the invention, the storage unit may include any other number of storage spaces. The storage unit 100 contains three data processing systems 102, 104 and 106. The storage unit 100 also includes two empty storage spaces, such as empty storage space 108. In other embodiments of the invention, the storage unit may include any number of data processing systems and any number of empty storage spaces (including zero). The data processing systems may be fixed in the storage unit using, for example, fixing means (not shown) known to those skilled in the art of data processing system storage units such as, for example, server racks or server cabinets, although in other embodiments any other means of fixing the data processing systems within the storage unit may be used.

The storage unit 100 includes a cooling system that includes an air inlet duct 112, an air outlet duct 114, a plurality of inlet conduits 116, a plurality of outlet conduits 118 and an air transfer system 120. The air transfer system 120 comprises a blower and refrigeration unit 122 and an extractor fan 124. The inlet conduits 116 comprise flexible tubes that are in fluid flow communication with the air inlet duct 112 such that air forced along the air inlet duct 112 may also be forced along the inlet conduits 116. Similarly, the outlet conduits 118 comprise flexible tubes that are in fluid flow communication with the air outlet duct 114 such that air forced into the outlet conduits 118 will be forced into the air outlet duct 114.

Each data processing system mounted within the storage unit 100 has one of the inlet conduits 116 connected to an inlet port on the data processing system, and has one of the outlet conduits 118 connected to an outlet port on the data processing system. For example, an inlet conduit 116 is connected to an inlet port 126 on the data processing system 106, and an outlet conduit 118 is connected to an outlet port 128 on the data processing system 106. The conduits may be connected to the ports using any connection means such as, for example, clips, screws, bolts and/or glue, although a releasable connection means may be preferred if it is intended that the data processing systems in the storage unit 100 may be removed and/or replaced.

The blower and refrigeration unit 122, when in operation, takes ambient air and forces it into the air inlet duct 112 via an inlet tube 130. The extractor fan 124 extracts air from the air outlet duct 114 via an outlet tube 132 and releases it to the surroundings. Air is forced along the air inlet duct 112 and along the inlet conduits 116. The air is then forced through the inside of the data processing systems 102, 104 and 106, thus cooling the components within the data processing systems. The air is then extracted from the data processing systems 102, 104 and 106, and extracted through the outlet conduit 114, outlet tube 132 and extractor fan 124.

Thus, two fans are used (the blower and extractor fan) to cool multiple data processing systems when the data processing systems are in operation, and the data processing systems can contain a reduced number of fans, or can even be fanless, or some or all of the fans in the data processing systems can be inactive. This provides a saving of power and a reduction in noise compared to storage units containing data processing systems where each data processing system includes more cooling fans that are being used.

The conduits 116 and 118 that are adjacent to empty storage spaces may be sealed such that air is not forced through these conduits. For example, the inlet 116 and outlet 118 conduits adjacent to empty storage spaces in the storage unit 100 of FIG. 1 may include end caps 140 and 142 respectively.

The cooling system in the storage unit 100 of FIG. 1 may include a temperature regulation system that includes a temperature sensor 150 and a thermostatic switch 152. The temperature sensor provides an indication of the temperature of the air within the air outlet duct 114. The thermostatic switch 152 controls the refrigeration part of the blower and refrigeration unit 122 in response to the indication of the temperature such that the temperature of the air extracted from the air outlet duct 114 remains substantially constant, and/or substantially within upper and lower thresholds. For example, the thermostatic switch 152 may activate the refrigeration part when the temperature rises above an upper threshold, and deactivate the refrigeration part when the temperature falls below a lower threshold. The blower part of the blower and refrigeration unit 122 may continue to force air into the air inlet duct 112 even when the refrigeration part has been deactivated.

Figure 2:
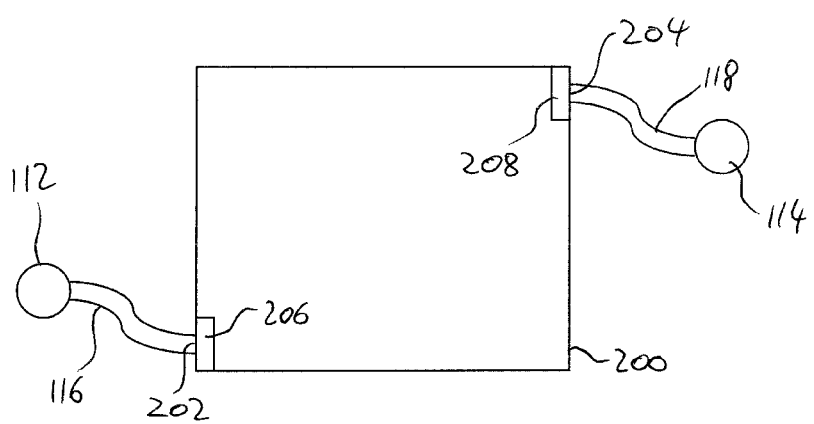
FIG. 2 shows a plan view of a data processing system according to embodiments of the invention.

FIG. 2 shows an example of a data processing system 200 according to embodiments of the invention. The data processing system 200 includes an inlet port 202 connected to an inlet conduit 116 that is connected to the air inlet duct 112. The data processing system 200 also includes an outlet port 204 connected to an outlet conduit 118 that is connected to the outlet duct 114. The inlet 202 and outlet 204 ports are located substantially diagonally opposite each other, such that air that is forced into the inlet port 202 and out of the outlet port 204 moves over as many of the components within the data processing system 200 as possible.

The data processing system 200 includes an inlet port sealing valve 206 for sealing the inlet port 202, and an outlet port sealing valve 208 for sealing the outlet valve 204. The sealing valves 206 and 208 may be used to close the ports 202 and 204 respectively when the data processing system 200 is not in operation, for example when the data processing system 200 is switched off or when the data processing system 200 is removed from the storage unit. The sealing valves 206 and 208 may be powered by fan headers (not shown) within the data processing system 200 that would otherwise be used to power cooling fans within the data processing system. The fan headers may also be used to provide feedback to the data processing system 200 in the event of failure or malfunction of one or both of the sealing valves 206 and 208.

Using flexible tubes for the conduits 116 and 118 ensures that the data processing systems can be easily installed within the storage unit and connected to the cooling system. Some movement of the data processing systems is also allowed, for example a data processing system may be partially or fully moved out of position for maintenance and/or upgrades before it is disconnected from the cooling system. The cooling system may not even need to be disconnected. The ducts 112 and 114 may be rigid and constructed using, for example, stainless steel or some other substantially rigid material.

The cooling system comprising the ducts 112 and 114 and conduits 116 and 118 are shown within the storage unit 100 of FIG. 1. However in other embodiments, the cooling system may be mounted outside of the storage unit. In any case, an existing storage unit could be modified such that it includes a cooling system according to embodiments of the invention. Similarly, existing data processing systems could be modified such that they are fanless when in operation, or they contain a reduced number of fans, or one or more of the fans are deactivated, for example by removing connection to a fan header.

A storage unit according to embodiments of the invention may include a backup air transfer system (not shown) that may operate to force air into the air inlet duct 112 and/or extract air from the air outlet duct 114 in the event of partial or full failure of the blower and refrigeration unit 122 and/or extractor fan 124. Therefore, failure of the blower and refrigeration unit 122 and/or extractor fan 124 may not require immediate maintenance as the cooling system would continue operating to cool the data processing systems.

Embodiments of the invention may include some other means of forcing air into the air inlet duct instead of a blower. For example, a fan, compressor and/or other means may be used. Similarly, some other means may be used in place of the extractor fan. Embodiments of the invention may include one or both of means for forcing air into the inlet duct, and means for extracting air from the outlet duct.

Embodiments of the invention may omit the refrigeration part of the blower and refrigeration unit 122, or cause the refrigeration part to be inactive, where, for example, the ambient air around the storage unit is cool enough.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed. The claims should not be construed to cover merely the foregoing embodiments, but also any embodiments which fall within the scope of the claims.

The invention claimed is:

1. A data processing system storage unit for storing a plurality of data processing systems, comprising:
    a plurality of storage spaces, wherein each storage space is configured for storing a data processing system;
    an air inlet duct and an air outlet duct;
    a plurality of inlet conduits, wherein each inlet conduit is configured for connecting the air inlet duct to an inlet port of a data processing system;
    a plurality of outlet conduits, wherein each outlet conduit is configured for connecting the air outlet duct to an outlet port of a data processing system, and wherein the inlet port and the outlet port are located on substantially different faces of the data processing system and are substantially diagonally opposite each other;
    at least one valve for substantially closing at least one of the inlet port and the outlet port, wherein the at least one valve is coupled to the at least one of the inlet port and the outlet port from within the data processing system, the at least one valve comprising a first sealing valve for closing the inlet port and a second sealing valve for closing the outlet port, wherein the first valve is coupled to the inlet port from within the data processing system, and the second valve is coupled to the outlet port from within the data processing system, and the first and second sealing valves are powered by fan headers within the data processing system; and
    a primary air transfer system for at least one of directing air into the air inlet duct and extracting air from the air outlet duct.

2. The data processing system storage unit of claim 1, wherein the primary air transfer system comprises at least one of a blower, a compressor and a fan for forcing air into the air inlet duct.

3. The data processing system storage unit of claim 1, wherein the primary air transfer system comprises an extractor fan for extracting air from the air outlet duct.

4. The data processing system storage unit of claim 1, wherein the primary air transfer system comprises a refrigeration unit for cooling the air before it enters the air inlet duct.

5. The data processing system storage unit of claim 4, additionally comprising a thermostatic controller for controlling the refrigeration unit in response to a temperature sensor that senses temperature of air in the air outlet duct such that the air in the air outlet duct is maintained at a substantially constant temperature.

6. The data processing system storage unit of claim 1, comprising a backup air transfer means for at least one of directing, air into the air inlet duct and extracting air from the air outlet duct in response to failure of the primary air transfer system.

7. The data processing system storage unit of claim 1, wherein air is delivered out of the data processing system through the plurality of outlet conduits and into the air outlet duct.

8. The data processing system storage unit of claim 1, wherein the fan headers provide feedback to the data processing system in the event of failure or malfunction of one or both of the sealing valves.

9. A data processing system storage unit for storing a data processing system, comprising:
    an air inlet duct and an air outlet duct;
    a plurality of inlet conduits, each inlet conduit for connecting the air inlet duct to an inlet port of the data processing system;
    a plurality of outlet conduits, each outlet conduit for connecting the air outlet duct to an outlet port of the data processing system, and wherein the inlet port and the outlet port are located on substantially different faces of the data processing system and are substantially diagonally opposite each other;
    at least one valve for substantially closing at least one of the inlet port and the outlet port, wherein the at least one valve is coupled to the at least one of the inlet port and the outlet port from within the data processing system, the at least one valve comprising a first sealing valve for closing the inlet port and a second sealing valve for closing the outlet port, wherein the first valve is coupled to the inlet port from within the data processing system, and the second valve is coupled to the outlet port from within the data processing system, and the first and second sealing valves are powered by fan headers within the data processing system; and
    a primary air transfer system for at least one of directing, air into the air inlet duct and extracting air from the air outlet duct.

10. The data processing system storage unit of claim 9, wherein the primary air transfer system comprises at least one of a blower, a compressor and a fan for forcing air into the air inlet duct.

11. The data processing system storage unit of claim 9, wherein the primary air transfer system comprises an extractor fan for extracting air from the air outlet duct.

12. The data processing system storage unit of claim 9, wherein the primary air transfer system comprises a refrigeration unit for cooling the air before it enters the air inlet duct.

13. The data processing system storage unit of claim 12, additionally comprising a thermostatic controller for controlling the refrigeration unit in response to a temperature sensor that senses temperature of air in the air outlet duct such that the air in the air outlet duct is maintained at a substantially constant temperature.

14. The data processing system storage unit of claim 9, comprising a backup air transfer means for at least one of directing air into the air inlet duct and extracting air from the air owlet duct in response to failure of the primary air transfer system.

15. The data processing system storage unit of claim 9, wherein the fan headers provide feedback to the data processing system in the event of failure or malfunction of one or both of the sealing valves.

16. A data processing system stored in a data processing system storage unit comprising an inlet port for connecting to an inlet conduit and an outlet port for connecting to an outlet conduit such that air directed through at least one of the inlet conduit and an outlet conduit cools components within the data processing system, and at least one valve for substantially closing at least one of the inlet port and the outlet port, the at least one valve coupled to the at least one of the inlet port and the outlet port from within the data processing system, the inlet port and the outlet port located on substantially different faces of the data processing system and are substantially diagonally opposite each other, the at least one valve comprising a first sealing valve for closing the inlet port and a second sealing valve for closing the outlet port, wherein the first valve is coupled to the inlet port from within the data processing system, and the second valve is coupled to the outlet port from within the data processing system, and the first and second sealing valves are powered by fan headers within the data processing system.

17. A data processing system as claimed in claim 16, wherein the data processing system is a fanless system.

18. A data processing system as claimed in claim 16, wherein the valves are used to close the inlet port and the outlet port when the data processing system is not in operation.

19. The data processing system storage unit of claim 16, wherein the fan headers provide feedback to the data processing system in the event of failure or malfunction of one or both of the sealing valves.

* * * * *

UNITED STATES PATENT AND TRADEMARK OFFICE
CERTIFICATE OF CORRECTION

PATENT NO.       : 8,783,051 B2                                    Page 1 of 1
APPLICATION NO.  : 12/060804
DATED            : July 22, 2014
INVENTOR(S)      : Krishnamurthy Kundapur It is certified that error appears in the above-identified patent and that said Letters Patent is hereby corrected as shown below:

In the Claims

Column 5, line 9, in Claim 6, delete "directing," and insert -- directing --, therefor.

Column 5, line 45, in Claim 9, delete "directing," and insert -- directing --, therefor.

Column 6, line 16, in Claim 14, delete "owlet" and insert -- outlet --, therefor.

Signed and Sealed this
Ninth Day of December, 2014

Michelle K. Lee
*Deputy Director of the United States Patent and Trademark Office*